(12) United States Patent
Gassner (10) Patent No.: US 10,811,202 B2
(45) Date of Patent: Oct. 20, 2020

(54) SWITCH COVER BODY WITH A PLURALITY OF ELASTIC STOP RIBS

(71) Applicant: limoss (Dongguan) Co., Ltd., Dongguan, Guangdong (CN)

(72) Inventor: Christian Gassner, Guangdong (CN)

(73) Assignee: limoss (Dongguan) Co., Ltd., Dongguan (CN)

( * ) Notice: Subject to any disclaimer, the term of this patent is extended or adjusted under 35 U.S.C. 154(b) by 82 days.

(21) Appl. No.: 16/116,897

(22) Filed: Aug. 29, 2018

(65) Prior Publication Data

US 2019/0080867 A1 Mar. 14, 2019

(30) Foreign Application Priority Data

Sep. 11, 2017 (CN) ...................... 2017 2 1162201 U (51) Int. Cl.
| | | |
|---|---|---|
| *H01H 23/04* | (2006.01) | |
| *H01H 23/24* | (2006.01) | |
| *H05K 5/02* | (2006.01) | |
| *H01H 3/12* | (2006.01) | |
| *H01H 23/26* | (2006.01) | |
| *A47C 21/00* | (2006.01) | |

(52) U.S. Cl.
CPC .............. *H01H 23/24* (2013.01); *H01H 3/12* (2013.01); *H01H 23/04* (2013.01); *H01H 23/26* (2013.01); *H05K 5/0217* (2013.01); *H05K 5/0247* (2013.01); *A47C 21/003* (2013.01)

(58) Field of Classification Search
CPC ....... H01H 23/04; H01H 23/145; H02B 1/048
See application file for complete search history.

(56) References Cited

U.S. PATENT DOCUMENTS

| | | | | |
|---|---|---|---|---|
| 4,627,683 A | * | 12/1986 | Shimomura | ........... H02B 1/048 248/27.3 |
| 5,694,106 A | * | 12/1997 | Wang | ..................... H01H 71/16 337/79 |

* cited by examiner

*Primary Examiner* — Vanessa Girardi (57) ABSTRACT

The present invention belongs to the technical field of electric signal transmission and conversion devices, in particular to a novel embedded external power supply controller, comprising a base assembly, a cover body and a press-button, wherein the base assembly comprises a signal converter, the cover body is provided with an accommodation through cavity, the cover body is shielded outside the base assembly, the signal converter is received in the accommodation through cavity, the press-button is movably latched in the accommodation through cavity and abuts against a trigger terminal of the signal converter, an outer wall of the cover body protrudes and extends to form a plurality of stop ribs for reinforcing bonding force between the cover body and external components. In this way, it is ensured that the novel embedded external power controller and external device is stably fitted without impairing the use efficiency.

11 Claims, 5 Drawing Sheets

SWITCH COVER BODY WITH A PLURALITY OF ELASTIC STOP RIBS

CROSS-REFERENCES TO RELATED APPLICATIONS

This application claims the priority of Chinese patent application no. 201721162201.7, filed on Sep. 11, 2017, the entire contents of all of which are incorporated herein by reference.

FIELD OF THE INVENTION

The present invention belongs to the technical field of electric signal transmission and conversion devices, in particular to a novel embedded external power supply controller.

BACKGROUND OF THE INVENTION

In recent years, the concept of smart home has become more and more popular, and smart home is also the development trend of future home. This requires integration of traditional appliances (such as sofas) with electrical components.

In prior art, limit by the soft texture of the appliance such as a sofa, the electrical component is often not stably mounted in the sofa. As the sofa deforms, the electrical component easily moves relative to the surrounding soft object, thereby deviating from the mounting site. This causes unstable engagement of the electrical component with the external device, which not only reduces use efficiency of the electrical component, but also poses a potential risk that a short circuit of the electrical component may occur to cause a fire.

SUMMARY OF THE INVENTION

The present invention aims to provide a novel embedded external power supply controller, which is intended to solve the technical problem that the electrical components in a soft appliance such as a sofa in the prior art easily move with the deformation of the appliance and thus cannot be stably mounted.

In order to achieve the above object, the technical solution adopted by the present invention is: a novel embedded external power supply controller, comprising a base assembly, a cover body and a press-button, wherein the base assembly comprises a signal converter, the cover body is provided with an accommodation through cavity, the cover body is shielded outside the base assembly, the signal converter is received in the accommodation through cavity, the press-button is movably latched in the accommodation through cavity and abuts against a trigger terminal of the signal converter, an outer wall of the cover body protrudes and extends to form a plurality of stop ribs for reinforcing bonding force between the cover body and external components.

Further, an outer end portion of each of the stop ribs is inclined towards the upper end of the cover.

Further, the stop ribs are parallel to and spaced apart from each other on outer walls of opposite sides of the cover body, and a buffering through groove is formed between two adjacent stop ribs.

Further, each of the stop ribs is an elastic member.

Further, a lower end of the press-button is extended towards two sides to form two protruding knobs, an upper end of an inner wall of the accommodation through cavity is correspondingly provided with two limit holes, each of the protruding knobs is corresponding to and mated with one of the limit holes, the lower end of the press-button further extends downward to form a trigger portion for engaging with the signal converter, and the trigger portion abuts against the trigger terminal of the signal converter.

Further, the base assembly further comprises a mounting platform and a base, the mounting platform is mounted on the base, the signal converter is fixed on the mounting platform, a lower edge of the cover body is fixedly connected to an upper edge of the base, and the base and the mounting platform are both located in the accommodation through cavity.

Further, an upper end of the base extends upwardly to form a plurality of support columns, an upper end of each of the support columns is provided with an assembling step, an outer edge of the mounting platform is embedded and fixed in the assembling step, the base assembly further includes at least one limit buckle, an lower end of each of the at least one limit buckle is fixedly connected with the upper end of the base, an upper end of each of the at least one limit buckle is formed with an engagement groove, and an outer edge of the mounting platform extends into and is engaged in each of the engagement grooves.

Further, the upper end of the base further extends upwardly to form at least one limit rib, and each of the at least one limit rib is spaced apart from an outer edge of the base to form limit engagement grooves, a lower end of the cover body extends downwardly to form at least one limit flange, and each of the at least one limit flange is in one-to-one correspondence with and engaged with each of the limit engagement grooves, an inner wall of the cover body is recessed inwardly to form at least one limit recess, an upper end of the base further extends upwardly to form at least one limit inverted buckle, each of the at least one limit recess is in one-to-one correspondence with each of the at least one limit inverted buckle, and each of the at least one limit inverted buckle is respectively fitted in each of the at least one limit recess.

Further, a lower end of the signal converter is provided with a plurality of transmission pins, each of the transmission pins passes through the mounting platform, and extends downwardly and protrudes from a lower end of the mounting platform, a lower end of the base is provided with a communication hole for an electrical connection line to pass through, and the electrical connection line passes through the communication hole and is electrically connected to each of the transmission pins.

Further, the base assembly further includes an electrical connector, a lower end of the electrical connector is fixed on the mounting platform and is electrically connected to the electrical connection line, an upper end of the cover body is provided with an adapter hole, and an outer edge of an upper end of the electrical connector abuts against a hole edge of the adapter hole to allow the electrical connector to communicate with the external components.

The beneficial effects of the embodiments are as follows: for the novel embedded external power supply controller of the present invention, by setting the base assembly, the cover body and the press-button, the signal converter included in the base assembly can be stably mounted in the novel embedded external power supply controller, and the signal converter can then be activated upon pressing of the press-button and send an electric signal to the outside. By providing an accommodation through cavity in the cover body, the signal converter can be accommodated in the accommodation through cavity to be protected from external damage. By providing stop ribs on the outer wall of the cover body, when the novel embedded external power supply controller is assembled in an environment in which a soft object is present, the stop ribs can be inserted into the soft object, thereby increasing the contact area between the novel embedded external power controller and the external soft object and improving the friction between the novel embedded external power controller and the external soft object. In this way, it is ensured that the novel embedded external power controller and external device is stably fitted without impairing the use efficiency, which avoids the occurrence of a short circuit caused by the displacement of the novel embedded external power controller in the external soft object and a fire resulted therefrom.

BRIEF DESCRIPTION OF THE DRAWINGS

In order to more clearly illustrate the technical solutions in the embodiments of the present invention, the drawings used in the embodiments or the prior art description will be briefly described below. Obviously, the drawings in the following description illustrate merely some embodiments of the present invention. Other drawings may be obtained by those skilled in the art without an inventive step.

Among them, the various reference numerals in the figures are as follows:

10—base assembly, 11—mounting platform, 12—signal converter
13—base, 14—support column, 15—assembling step
16—limit buckle, 17—snap slot, 18—limit rib
19—limit engagement groove, 20—cover body, 21—accommodation through cavity
22—stop rib, 23—buffering through groove, 24—adaptor hole
25—fixation edge, 26—positioning cone, 30—press—button
31—protruding knob, 32—trigger unit, 111—limit inverse buckle
112—trigger terminal, 113—transfer pin, 114—connecting hole
115—electrical connection line, 116—electrical connector, 117—connecting pin
211—limit flange, 212—limit recess, 213—limit hole.

DETAILED DESCRIPTION OF ILLUSTRATED EMBODIMENTS

The embodiments of the present invention are described in detail below, and the examples of the embodiments are illustrated in the drawings, wherein the same or similar reference numerals are used to refer to the same or similar elements or elements having the same or similar functions. Embodiments 1 to 5 are described below with reference to the accompanying drawings, which are intended to be illustrative of the present invention and are not to be construed as limiting.

In the description of the present invention, it is to be understood that oriental or positional relationships indicated by the terms "length", "width", "upper", "lower", "front", "back", "left", "right", "vertical", "horizontal", "top", "bottom", "inside", "outside", etc. are oriental or positional relationships based on what is shown in the drawings for convenience of description of the present invention and simplified description, and it is not indicated or implied that the device or element should take or be configured and operated in the certain orientation. Therefore, the relationships are not intended to limit the present invention.

Moreover, the terms "first" and "second" are used for descriptive purposes only and are not to be construed as indicating or implying a relative importance or implicitly indicating the number of technical features indicated. Thus, features defined as "first" and "second" may include one or more of the features either explicitly or implicitly. In the description of the present invention, "a plurality of" means two or more unless specifically defined.

In the present invention, the terms "mount", "connected", "connect", "fix" and the like shall be understood broadly, and may be either fixed or detachable connection or integration; can be mechanical or electrical connection; can be directly connection or indirectly connection through an intermedium; or can be internal communication of two components or the interaction of two components. For those skilled in the art, the specific meanings of the above terms in the present invention can be understood based on the specific situation.

Figure 1:
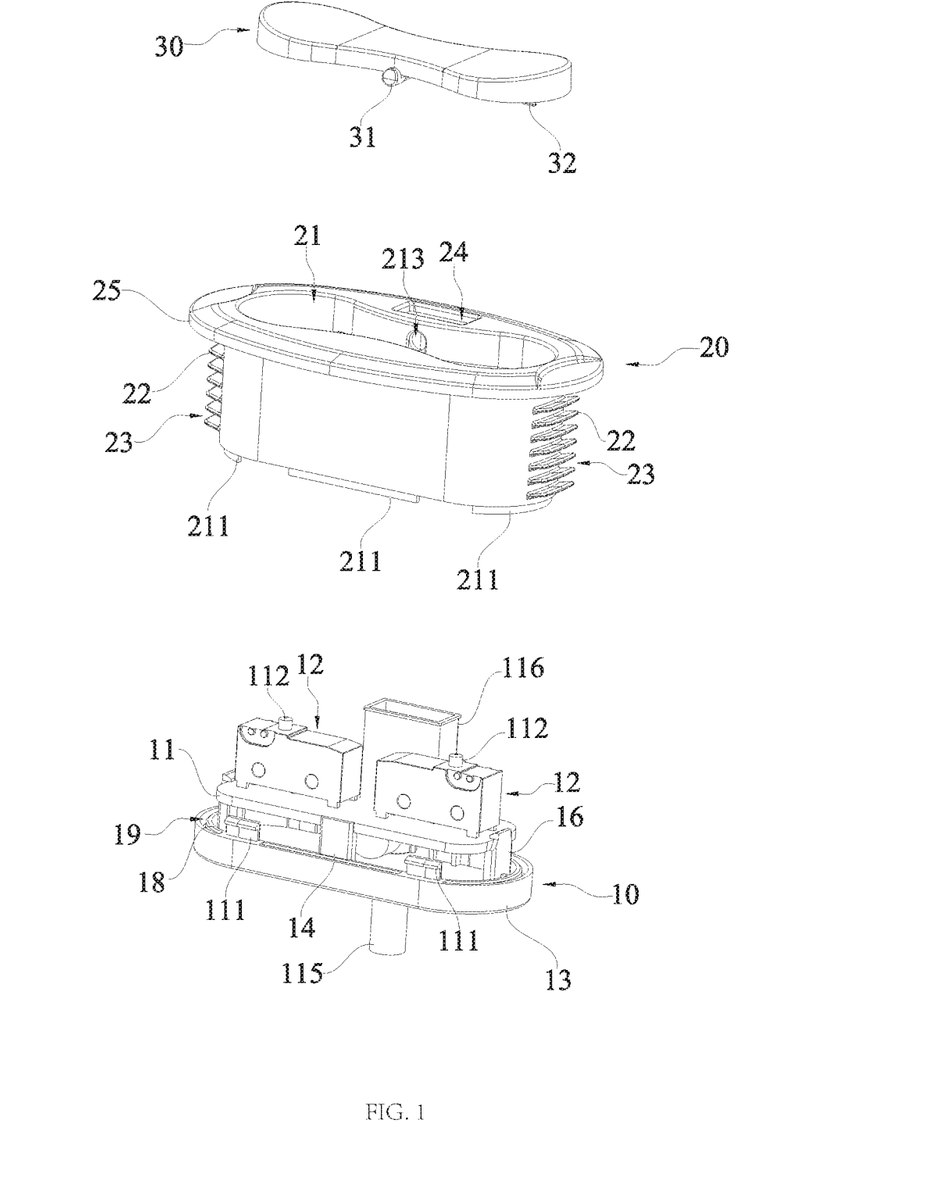
FIG. 1 is a schematic exploded view of a novel embedded external power supply controller according to an embodiment of the present invention.
Figure 2:
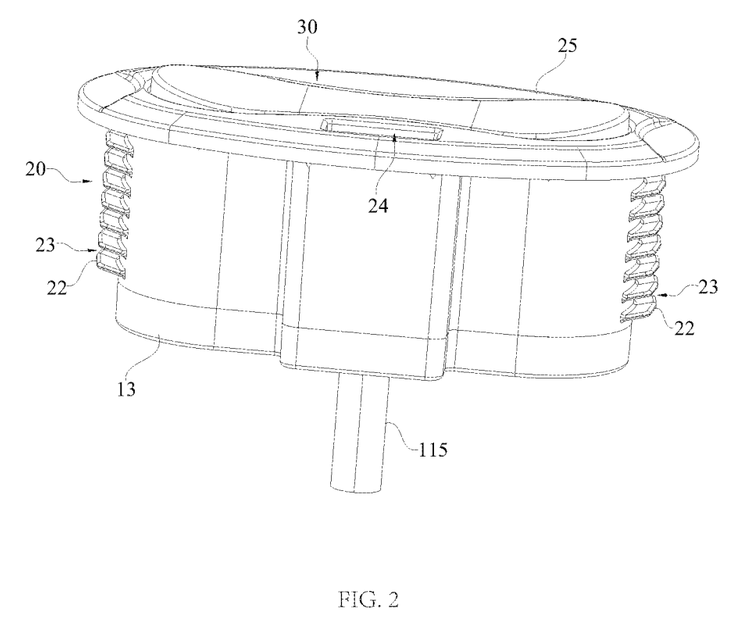
FIG. 2 is a schematic overall structural view of a novel embedded external power supply controller according to an embodiment of the present invention.
Figure 3:
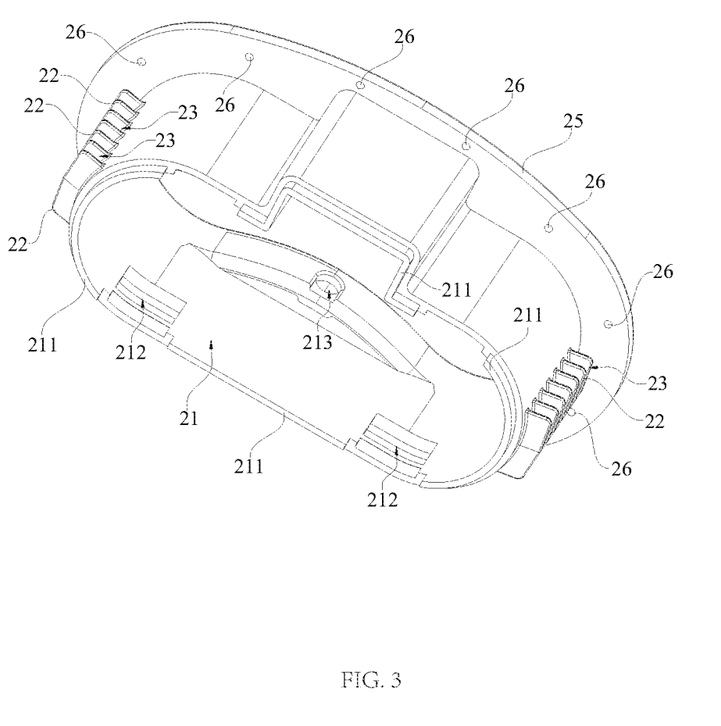
FIG. 3 is a schematic structural view of a cover body of a novel embedded external power supply controller according to an embodiment of the present invention.

As shown in FIG. 1 to FIG. 3, a novel embedded external power controller provided by an embodiment of the present invention includes a base assembly 10, a cover body 20 and a press-button 30. The base assembly 10 includes a signal converter 12, and the cover body 20 is provided with an accommodation through cavity 21. The cover body 20 is shielded outside the base assembly 10, and the signal converter 12 is received in the accommodation through cavity 21. The press-button 30 is movably latched in the accommodation through cavity 21 and abuts against a trigger terminal 112 of the signal converter 12. An outer wall of the cover body 20 protrudes and extends to form a plurality of stop ribs 22 for reinforcing bonding force between the cover body 20 and external components.

According to the novel embedded external power supply controller of the embodiment of the present invention, by providing the base assembly 10, the cover body 20 and the press-button 30, the signal converter 12 of the base assembly 10 can be stably mounted in the novel embedded external power supply controller, and the signal converter 12 can then be activated under the pressed state of the press-button 30 and send an electric signal to the external components. By providing the accommodation through cavity 21 in the cover body 20, the signal converter 12 can be accommodated in the accommodation through cavity 21, thereby being protected from external damage. By providing the stopper rib 22 on the outer wall of the cover body 20, when the novel embedded external power supply controller is assembled and used in an environment in which a relatively soft object is present, the stopper rib 22 can be inserted into the soft object, thereby increasing the contact area between the novel embedded external power controller and the external soft object and enhancing the friction between the novel embedded external power controller and the external soft object. Therefore, when the soft object is pressed by external force and is elastically deformed, the novel embedded external power supply controller can be displaced along with the external soft object without relative displacement between the two. Then when the external force is removed and the external soft object is restored to its initial shape, the novel embedded external power controller can return to its initial position with the external soft object, thereby ensuring that the novel embedded external power controller will not move relative to the surrounding soft object and thus not deviate from the mounting location when it is assembled in the external soft object. In this way, it is ensured that the novel embedded external power supply controller mounted in the soft object is stably matched with the external equipment, thereby ensuring that the performance of the novel embedded external power supply controller will not be impaired and avoiding short-circuit of the novel embedded external power supply controller when it is randomly displaced in the external soft object and thus a fire.

In the present embodiment, as shown in FIGS. 1 to 3, the outer end portions of the respective stopper ribs 22 are inclined towards the upper end of the cover body 20. Specifically, the joints of the respective stopper ribs 22 with the outer wall of the cover body 20 and the mounting strips are set as rounded transitions, and the outer ends of the respective mounting strips are also rounded.

Further, by arranging the outer end portions of the respective stopper ribs 22 towards the upper end of the cover body 20, the respective stopper ribs 22 can form acute angles with the outer wall of the cover body 20. Therefore, when the controller has a tendency to move in an oblique direction towards the stopper rib 22 with respect to the external soft object, each of the assembly strips can be inserted into the external soft object, thereby effectively preventing the novel embedded external power supply controller from moving in an oblique direction towards the stopper rib 22 with respect to the external soft object, which further prevents relative displacement between the novel embedded external power supply controller and the external soft object.

Further, the joints of the respective stop ribs 22 with the cover body 20 are set as rounded transitions. In this way, the joints between the respective stop ribs 22 and the cover body 20 are less likely to be cracked due to stress concentration phenomenon, thereby preventing the stop ribs 22 from breaking off the outer wall of the cover body 20. By making the outer end portions of the respective fitting strips rounded, the outer end portions of the stop ribs 22 can be prevented from being scratched with the external soft object, thereby ensuring that the external soft object around the stop rib 22 is always in good condition.

Optionally, the outer wall of the cover body 20 and the stop rib 22 can be made of a metallic material, so that when static electricity is accumulated in the novel embedded external power controller, static electricity can be transmitted to the stop ribs 22 along the outer wall of the cover body 20 and is discharged to the outside by the stop ribs 22, so that the internal static electricity of the novel embedded external power supply controller is eliminated, thereby avoiding spark generated by the static electricity accumulation inside the novel embedded external power supply controller and thus ignition of the external soft object which may cause a fire.

Figure 4:
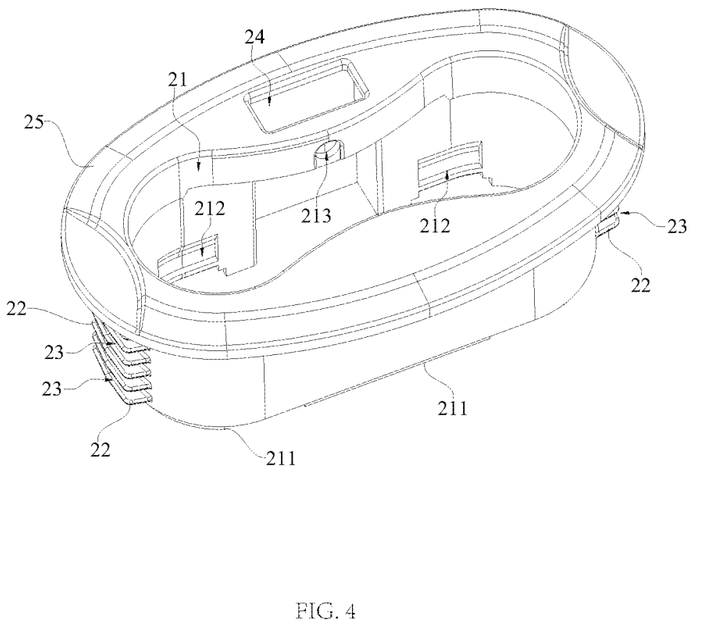
FIG. 4 is another schematic structural view of a cover body of a novel embedded external power supply controller according to an embodiment of the present invention.

In this embodiment, as shown in FIG. 1, FIG. 2 and FIG. 4, the stop ribs 22 are parallel to each other and spaced apart from each other on the outer walls of the opposite sides of the cover body 20, and a buffering through groove 23 is formed between two adjacent stop ribs. Also, the respective stop ribs 22 are elastic members. Specifically, the spacing between every two adjacent stop ribs 22 is equal, and the number of the stop ribs 22 provided on the outer walls of the opposite sides of the cover body 20 is uniform and preferably 5 to 10.

Further, the respective stop ribs 22 is disposed on the outer wall of the opposite sides of the cover body 20 in parallel and evenly spaced apart from each other, and a buffering through groove 23 is formed between two adjacent stop ribs 22. Thus, since the respective stop ribs 22 is arranged parallel to each other and equally spaced, the volume and mass of the outer soft object accommodated within the buffering through groove 23 formed by the respective stop ribs 22 on the outer wall of the opposite sides of the cover body 20 can be kept consistent, and the forces exerted by the external soft object on the outer walls of the opposite sides of the cover body 20 are consistent, thereby avoiding inconsistent external forces exerted on the outer walls of the opposite sides and thus deflection of the cover body 20 towards the side subjected to larger force, which further improves the stopping performance of the novel embedded external power controller with the stop rib 22 in the external soft object.

Preferably, the number of the stop ribs 22 provided on each of the outer walls of the opposite sides of the cover body 20 is seven, so that a balance is achieved between the mounting difficulty of the mounting ribs 22 and the stopping performance of the novel embedded external power controller with the stop rib 22 in the external soft object, which avoids significant rise of overall production cost of the novel embedded external power controller due to the excessive number of the stop ribs 22 and prevents insufficient stopping performance of the stop ribs 22 which would otherwise cause the novel embedded external power supply controller to move easily relative to the external soft object.

Further, by setting the stop ribs 22 as elastic members, the stop ribs 22 are prevented from being subjected to a sudden impact force and being broken when they contact a hard object, and long-term stable serviceability of power controllers in complex conditions is enhanced.

Preferably, the novel embedded external power supply controller has a vertical overall size of 25 to 30 mm. Specifically, the vertical integrated overall size of the novel embedded external power controller may be 25 mm, 26 mm, 27 mm, 28 mm, 29 mm, or 30 mm.

In the present embodiment, as shown in FIG. 1 and FIG. 2, the lower end of the press-button 30 is extended to the two sides to form two protruding knobs 31, and the upper end of the inner wall of the accommodation through cavity 21 is correspondingly provided with two limit holes 213. Each of the protruding knobs 31 is corresponding to and matches with one of the limit holes 213. The lower end of the press-button 30 is further extended downward to form a trigger portion 32 for press engagement with the trigger terminal 112 of the signal converter 12, and the trigger portion 32 abuts against the trigger terminal 112 of the signal converter 12. Specifically, each of the protruding knobs 31 is in clearance engagement with one of the limit holes 213.

Further, by making each of the protruding knobs 31 corresponding to and matching with one of the limit holes 213 and leaving a proper gap between the protruding button 31 and the limit hole 213, a moving connection of the press-button 30 with the cover body 20 can be achieved. Thus the press-button 30 can be rotated relative to the cover body 20 and contact the trigger terminal 112 of the signal converter 12 to effect triggering of the signal converter 12.

Further, by extending the lower end of the press-button 30 downward to form the trigger portion 32, the trigger portion 32 can abut against the trigger terminal 112 of the signal converter 12 during the rotation of the press-button 30 relative to the cover body 20 and exert certain pressure on the trigger terminal 112. The signal converter 12 can convert the pressure signal into an electric signal after sensing the pressure signal, and simultaneously transmit the electric signal to the external device, thus achieving control of the external device via pressing the press-button 30.

Figure 5:
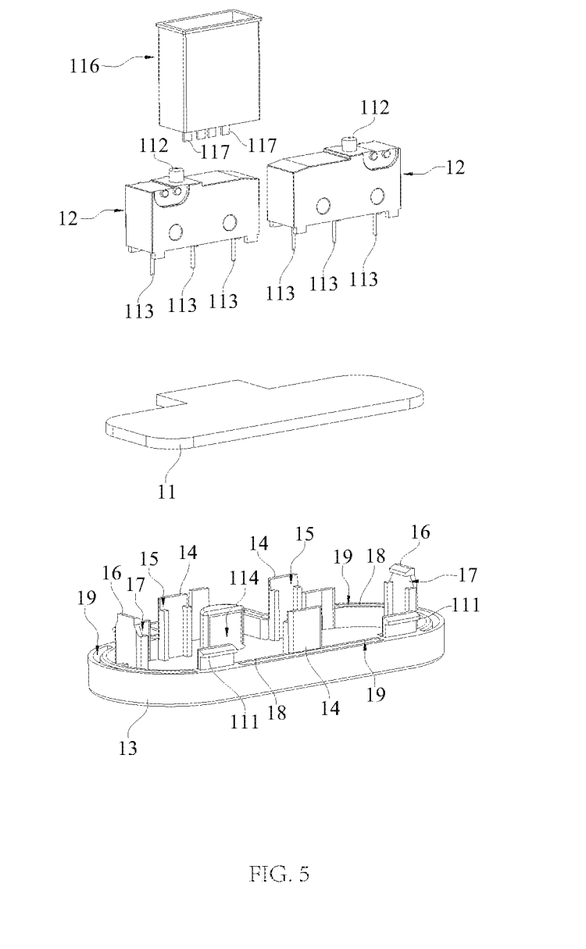
FIG. 5 is a schematic exploded view of a base assembly of a novel embedded external power supply controller according to an embodiment of the present invention.

In this embodiment, as shown in FIG. 1, FIG. 2 and FIG. 5, the base assembly 10 further includes a mounting platform 11 and a base 13. The mounting platform 11 is mounted on the base 13, and the signal converter 12 is fixed on the mounting platform 11. The lower edge of the cover body 20 is fixedly connected to the upper edge of the base 13, and the base 13 and the mounting platform 11 are both located in the accommodation through cavity 21.

Further, by mounting the mounting platform 11 on the base 13, a secure attachment of the mounting platform 11 within the base assembly 10 is thus achieved. By fixing the signal converter 12 to the mounting platform 11, the signal converter 12 can be prevented from being directly mounted to the base 13, so that a more sufficient assembly space is obtained. The lower edge of the cover body 20 is fixedly connected to the upper edge of the base 13, and the base 13 and the mounting platform 11 are both located in the accommodation through cavity 21, so that the base 13 and the mounting platform 11 are effectively protected by the cover body 20.

In the present embodiment, as shown in FIG. 1, FIG. 2 and FIG. 5, the upper end of the base 13 extends upwardly to form a plurality of support columns 14. The upper ends of the support columns 14 are respectively provided with an assembling step 15, and the outer edge of the mounting platform 11 is embedded into the assembling step 15. The base assembly 10 further includes at least one limit buckle 16. The lower end of each limit buckle 16 is fixedly connected to the upper end of the base 13, and the upper end of each limit buckle 16 is formed with engagement grooves 17. The outer edge of the mounting platform 11 extends into and is engaged in the respective engagement grooves 17.

Further, by fitting the outer edge of the mounting platform 11 into the assembling step 15 which is fixed to the upper end of the support column 14 of the base 13, the assembling step 15 is easier to form, and fitting and operation between the outer edge of the mounting platform 11 and the assembling step 15 is simple. In this way, a simple and stable connection between the mounting platform 11 and the base 13 via assembling is realized.

Preferably, there are three support columns 14, in which two support columns 14 correspond to one side of the mounting platform 11, and the other support column 14 corresponds to the opposite side of the mounting platform 11. The three support columns 14 form a solid triangular relationship and provide sufficient support for the mounting platform 11. At the same time, the number of the support columns 14 is limited to three, which avoids excessive number of the support columns 14 and thus rise of high manufacturing cost of the base assembly 10. Also, the number of the support columns 14 is also prevented from being too small, which would otherwise lead to unstable support of the base 13 to for the mounting platform 11.

Further, by fixedly connecting the lower end of each of the limit buckles 16 to the upper end of the base 13, the outer edge of the mounting platform 11 is embedded in the engagement groove 17 of each of the limit buckles 16. This further improves the connection stability of the mounting platform 11 and the base 13.

Preferably, there are two limit buckles 16, and the two limit buckles 16 respectively correspond to the two sides of the mounting platform 11 not fitted with the support columns 14. In this way, a stable connection between the peripheral outer edge of the mounting platform 11 and the base 13 is achieved through the support columns 14 and the limit buckles 16, thereby ensuring safety of the signal converter 12 mounted on the mounting platform 11.

In this embodiment, as shown in FIG. 1, FIG. 2 and FIG. 5, the upper end of the base 13 further extends upwardly to form at least one limit rib 18, and each limit rib 18 is spaced apart from the outer edge of the base 13 to form limit engagement grooves 19. The lower end of the cover body 20 extends downwardly to form at least one limit flange 211, and each limit flange 211 is in one-to-one correspondence with and engaged with each of the limit engagement grooves 19. The inner wall of the cover body 20 is recessed inwardly to form at least one limit recess 212. The upper end of the base 13 further extends upwardly to form at least one limit inverted buckle 111. Each limit recess 212 is in one-to-one correspondence with each limit inverted buckle 111, and each limit inverted buckle 111 is respectively fitted in each limit recess 212.

Further, by engaging the limit ribs 18 with the limit engagement grooves 19, on one hand, precise seamless docking is achieved between the base 13 and the cover body 20, thereby ensuring that external impurities do not pass through the gap between the base 13 and the cover body 20 to enter into the interior of the novel embedded external power supply controller and affect normal operation of the electronic components. On the other hand, it facilitates stable assembly between the base 13 and the cover body 20.

Further, by engaging the limit buckles 111 in the respective limit recesses 212, the base 13 and the cover body 20 can be further stably connected, and it is ensured that the cover body 20 and the base 13 would not be separated by the pulling force from the outside.

In the present embodiment, as shown in FIG. 1, FIG. 2 and FIG. 5, the lower end of the signal converter 12 is provided with a plurality of transmission pins 113, each of which passes through the mounting platform 11, extends downwardly and protrudes from the lower end of the mounting platform 11. The lower end of the base 13 is provided with a communication hole 114 for an electrical connection line 115 to pass through. The electrical connection line 115 passes through the communication hole 114 and is electrically connected to each transmission pin 113.

Further, by providing the transmission pin 113 at the lower end of the signal converter 12 and electrically connecting the transmission pin 113 to the electrical connection line 115, when the press-button 30 triggers the signal converter 12, the signal converter 12 converts the pressure signal given by the pressure switch into an electric signal, which is then transmitted to the electrical connection line 115 through the transmission pin 113, and after that the electric signal is transmitted by the electrical connection line 115 to a related external device.

Preferably, there are two signal converters 12, and there are also two trigger portions 32 of the pressure-sensitive button 30. In this way, by providing two signal converters 12, it is realized that different signal converters 12 are triggered to output different electric signals, and then the external devices that are electrically connected to the novel embedded external power supply controller are sent different instructions.

In this embodiment, as shown in FIG. 1, FIG. 2 and FIG. 5, the base assembly 10 further includes an electrical connector 116. The lower end of the electrical connector 116 is fixed on the mounting platform 11 and is electrically connected to the electrical connection line 115. The upper end of the cover body 20 is provided with an adapter hole 24, and the outer edge of the upper end of the electrical connector 116 abuts against a hole edge of the adapter hole 24 to allow the electrical connector 116 to communicate with the outside.

Further, the lower end of the electrical connector 116 can also be provided with a connecting pin 117, and the connecting pin 117 is electrically connected to the electrical connecting line 115. In this manner, the electrical connector 116 is electrically connected to the electrical connection line 115. Further, the electrical connector 116 is specifically a USB input port. Therefore, an external device such as a mobile terminal can be electrically connected to the novel embedded external power supply controller through the USB input port, and the novel embedded external power supply controller can be electrically connected to the external power supply, so that the external power supply can be used to provide power for consumer devices such as mobile terminals through the novel embedded external power controller.

In this embodiment, as shown in FIG. 1, FIG. 2 and FIG. 5, the upper end of the cover body 20 further extends outward to form a fixed rim 25, and the lower end of the fixed rim 25 extends downward to form a plurality of positioning cones 26 for positioning in cooperation with external positioning objects.

Further, by providing the fixed rim 25, the fixed rim 25 can be fitted with the surface layer of the external soft object, thus further limiting the relative movement of the novel embedded external power supply controller relative to external soft object. At the same time, since the outer wall of the cover body 20 is further provided with a plurality of stop ribs 22, the fixed rim 25 can cooperate with the stop ribs 22, so that the novel embedded external power supply controller is firmly fixed to the external soft object, which further enhances the stability of the novel embedded external power controller in the external soft object.

The above disclosed embodiments are merely preferred embodiments of the present invention, and certainly do not limit the scope of the present invention. Therefore, equivalent changes made according to the scope of the present invention for patent application still fall within the scope of the present invention.

What is claimed is:

1. A novel embedded external power supply controller comprising a base assembly, a cover body and a press-button, wherein the base assembly comprises a signal converter, the cover body is provided with an accommodation through cavity, the cover body is shielded outside the base assembly, the signal converter is received in the accommodation through cavity, the press-button is movably latched in the accommodation through cavity and abuts against a trigger terminal of the signal converter, an outer wall of the cover body protrudes and extends to form a plurality of stop ribs;

wherein the base assembly further comprises a mounting platform and a base, the mounting platform is mounted on the base; and wherein an upper end of the base extends upwardly to form a plurality of support columns, an upper end of each of the support columns is provided with an assembling step, an outer edge of the mounting platform is embedded and fixed in the assembling step, the base assembly further includes at least one limit buckle, an lower end of each of the at least one limit buckle is fixedly connected with the upper end of the base, an upper end of each of the at least one limit buckle is formed with an engagement groove, and an outer edge of the mounting platform extends into and is engaged in each engagement groove.

2. The novel embedded external power supply controller according to claim 1, wherein an outer end portion of each of the stop ribs is inclined towards the upper end of the cover.

3. The novel embedded external power supply controller according to claim 1, wherein the stop ribs are parallel to and spaced apart from each other on outer walls of opposite sides of the cover body, and a buffering through groove is formed between two adjacent stop ribs.

4. The novel embedded external power supply controller according to claim 1, wherein each of the stop ribs is an elastic member.

5. The embedded external power supply controller according to claim 1, wherein a lower end of the press-button is extended towards two sides to form two protruding knobs, an upper end of an inner wall of the accommodation through cavity is correspondingly provided with two limit holes, each of the protruding knobs is corresponding to and mated with one of the limit holes, the lower end of the press-button further extends downward to form a trigger portion for engagement with the signal converter, and the trigger portion abuts against the trigger terminal of the signal converter.

6. The embedded external power supply controller according to claim 1, wherein the signal converter is fixed on the mounting platform, a lower edge of the cover body is fixedly connected to an upper edge of the base, and the base and the mounting platform are both located in the accommodation through cavity.

7. The embedded external power supply controller according to claim 1, wherein the plurality of support columns comprise three support columns, in which two support columns correspond to one side of the mounting platform, and the other support column corresponds to the opposite side of the mounting platform.

8. The embedded external power supply controller according to claim 7, wherein the at least one limit buckle comprises two limit buckles, and the two limit buckles respectively correspond to the two sides of the mounting platform not fitted with the support columns.

9. The embedded external power supply controller according to claim 6, wherein the upper end of the base further extends upwardly to form at least one limit rib, and each of the at least one limit rib is spaced apart from an outer edge of the base to form limit engagement grooves, a lower end of the cover body extends downwardly to form at least one limit flange, and each of the at least one limit flange is in one-to-one correspondence with and engaged with each of the limit engagement grooves, an inner wall of the cover body is recessed inwardly to form at least one limit recess, an upper end of the base further extends upwardly to form at least one limit inverted buckle, each of the at least one limit recess is in one-to-one correspondence with each of the at least one limit inverted buckle, and each of the at least one limit inverted buckle is respectively fitted in each of the at least one limit recess.

10. The novel embedded external power supply controller according to claim 6, wherein a lower end of the signal converter is provided with a plurality of transmission pins, each of the transmission pins passes through the mounting platform, extends downwardly and protrudes from a lower end of the mounting platform, a lower end of the base is provided with a communication hole for an electrical connection line to pass through, and the electrical connection line passes through the communication hole and is electrically connected to each of the transmission pins.

11. The novel embedded external power supply controller according to claim 10, wherein the base assembly further includes an electrical connector, a lower end of the electrical connector is fixed on the mounting platform and is electrically connected to the electrical connection line, an upper end of the cover body is provided with an adapter hole, and an outer edge of an upper end of the electrical connector abuts against a hole edge of the adapter hole to allow the electrical connector to communicate with the outside.

* * * * *